(12) United States Patent
Shim et al.

(10) Patent No.: US 9,337,245 B2
(45) Date of Patent: May 10, 2016

(54) METHOD OF MANUFACTURING ORGANIC ELECTROLUMINESCENCE DEVICE

(71) Applicant: Samsung Display Co., Ltd., Yongin, Gyeonggi-do (KR)

(72) Inventors: Woo Sub Shim, Seoul (KR); Byung Seon An, Hwaseong-si (KR); Geun Tak Kim, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 73 days.

(21) Appl. No.: 14/030,837

(22) Filed: Sep. 18, 2013

(65) Prior Publication Data

US 2014/0356994 A1    Dec. 4, 2014

(30) Foreign Application Priority Data

May 28, 2013 (KR) .......... 10-2013-0060428

(51) Int. Cl.
*H01L 27/32* (2006.01)
*H01L 21/02* (2006.01)
*H01L 51/00* (2006.01)

(52) U.S. Cl.
CPC ...... *H01L 27/3246* (2013.01); *H01L 21/02343* (2013.01); *H01L 51/0004* (2013.01)

(58) Field of Classification Search
CPC .................. H01L 21/02225; H01L 21/02227; H01L 21/02296
See application file for complete search history.

(56) References Cited

U.S. PATENT DOCUMENTS

| | | | |
|---|---|---|---|
| 2005/0003567 A1* | 1/2005 | Yasukawa | H01L 27/3246 438/30 |
| 2005/0024599 A1* | 2/2005 | Katagami et al. | 353/84 |
| 2009/0141218 A1* | 6/2009 | Zhou et al. | 349/106 |
| 2010/0295033 A1* | 11/2010 | Rokuhara et al. | 257/40 |

FOREIGN PATENT DOCUMENTS

| | | |
|---|---|---|
| KR | 10-2003-0059628 A | 7/2003 |
| KR | 10-2003-0079558 A | 10/2003 |
| KR | 10-2004-0000825 A | 1/2004 |
| KR | 10-2011-0094458 A | 8/2011 |

* cited by examiner

*Primary Examiner* — Cheung Lee
(74) *Attorney, Agent, or Firm* — Knobbe, Martens, Olson & Bear, LLP

(57) ABSTRACT

A method of manufacturing an organic electroluminescence device is disclosed. In one aspect, the method includes forming color patterns on a substrate, and forming a pixel defining layer between the color patterns.

6 Claims, 19 Drawing Sheets

METHOD OF MANUFACTURING ORGANIC ELECTROLUMINESCENCE DEVICE

CROSS-REFERENCE TO RELATED APPLICATIONS

This application claims priority from Korean Patent Application No. 10-2013-0060428 filed on May 28, 2013 in the Korean Intellectual Property Office, the disclosure of which is incorporated herein by reference in its entirety.

BACKGROUND

1. Field

The described technology generally relates to a method of manufacturing an organic electroluminescence device, more particularly, to a method of forming color patterns on a substrate and forming a pixel defining layer between the color patterns.

2. Description of the Related Technology

Semiconductor devices, such as display devices, and other electronic devices are increasingly becoming lighter, smaller, and more highly integrated. Micro-patterns, such as wiring and insulating films, are used to facilitate the miniaturization of semiconductor devices. Therefore, the ability to form precise micro-patterns at the lowest possible cost is becoming an important part of semiconductor device manufacturing.

In particular, organic electroluminescence devices generally require a pixel defining layer, an organic light-emitting layer, and the like to be micro-patterned precisely. Accordingly, various methods of forming micro-patterns are being researched.

In this regard, research is being directed to develop a method of forming precise micro-patterns at low cost.

SUMMARY OF CERTAIN INVENTIVE ASPECTS

One inventive aspect is a method of manufacturing an organic electroluminescence device.

However, aspects of the described technology are not restricted to the embodiments set forth herein. The above described method and other aspects of the described technology will become more apparent to one of ordinary skill in the art to which the described technology pertains by referencing the detailed description of the described technology given below.

Another aspect is a method of manufacturing an organic electroluminescence device, the method comprises forming color patterns on a substrate, and forming a pixel defining layer between the color patterns.

Another aspect is a method of manufacturing an organic electroluminescence device, the method comprising filling engraved concave portions of a first printing member with color ink, transferring the color ink from the first printing member onto a second printing member to form intermediate color ink patterns, printing the intermediate color ink patterns from the second printing member onto a substrate, and forming a pixel defining layer in a space between the color ink patterns formed on the substrate.

At least one embodiment of the described technology provides the following advantage.

It is possible to form more precise micro-patterns of a pixel defining layer and an organic light-emitting layer at a lower cost.

However, the effects of the described technology are not restricted to the above described advantage. The above and other effects of the described technology will become more apparent to one of ordinary skill in the art to which the described technology pertains by referencing the accompanying claims.

BRIEF DESCRIPTION OF THE DRAWINGS

The above description and other aspects and features of the described technology will become more apparent by describing in detail exemplary embodiments thereof with reference to the attached drawings.

DETAILED DESCRIPTION OF CERTAIN INVENTIVE EMBODIMENTS

Figure 1:
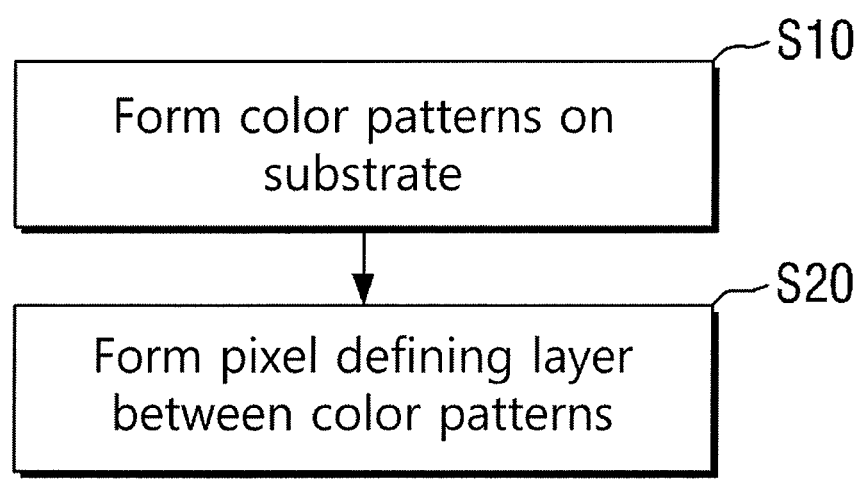
FIG. 1 is a schematic flowchart illustrating a method of manufacturing an organic electroluminescence device according to an embodiment.

Advantages and features of the described technology and methods of accomplishing the same may be more readily understood with reference to the following detailed description of preferred embodiments and the accompanying drawings. The described technology may, however, be embodied in many different forms and should not be construed as being limited to the embodiments set forth herein. Rather, these embodiments are provided so that the disclosure will be thorough and complete and will fully convey the concept of the described technology to those skilled in the art, and the described technology will only be defined by the accompanying claims. Like reference numerals refer to like elements throughout the specification.

The terminology used herein is for the purpose of describing particular embodiments only and is not intended to be limiting of the described technology. As used herein, the singular forms "a", "an" and "the" are intended to include the plural forms as well, unless the context clearly indicates otherwise. It will be further understood that the terms "comprises" and/or "comprising," when used in this specification, specify the presence of the stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, region, layer or section. Thus, a first element, component, region, layer or section discussed below could be termed a second element, component, region, layer or section without departing from the teachings of the described technology.

Spatially relative teems, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated by 90 degrees or at other orientations) and the spatially relative descriptors used herein should be interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result from, for example, manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the described technology.

Unless otherwise defined, all terms (including technical and scientific terms) used herein have the same meaning as commonly understood by one of ordinary skill in the art to which the described technology belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, exemplary embodiments of the described technology will be described with reference to the attached drawings.

Figure 2A:
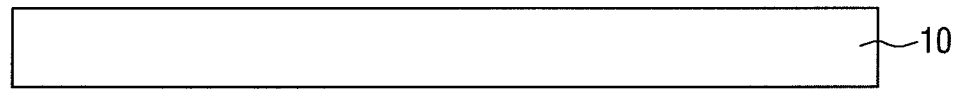
FIGS. 2A through 2C are schematic cross-sectional views illustrating a process of manufacturing an organic electroluminescence device according to an embodiment.
Figure 2B:
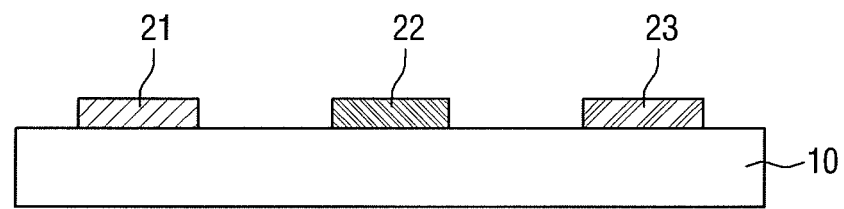
Figure 2C:
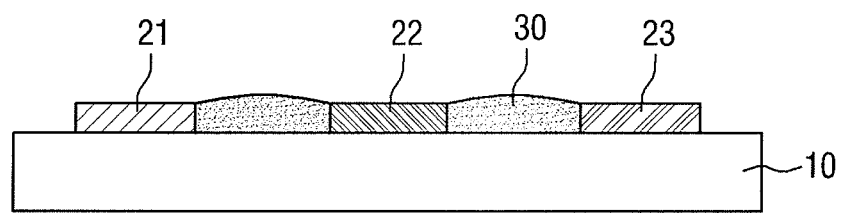
Figure 3A:
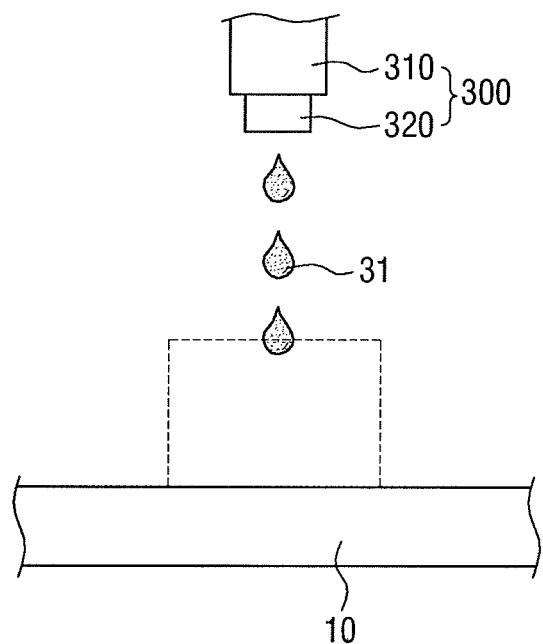
FIGS. 3A and 3B are cross-sectional views illustrating a process of forming a pixel defining layer on a substrate by using inkjet printing.
Figure 3B:
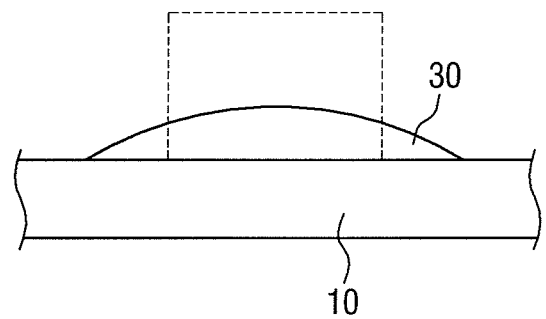

FIG. 1 is a schematic flowchart illustrating a method of manufacturing an organic electroluminescence device according to an embodiment of the described technology. FIGS. 2A through 2C are schematic cross-sectional views illustrating a process of manufacturing an organic electroluminescence device according to an embodiment of the described technology. FIGS. 3A and 3B are cross-sectional views illustrating a process of forming a pixel defining layer 30 on a substrate 10 by using inkjet printing.

Referring to FIGS. 1 through 3B, the method of manufacturing an organic electroluminescence device includes forming color patterns 21 through 23 on a substrate 10 (operation S10) and forming a pixel defining layer 30 between the color patterns 21 through 23.

Generally, the pixel defining layer 30 is formed first, and then the color patterns 21 through 23 are formed in spaces defined by the pixel defining layer 30. In this case, the pixel defining layer 30 is formed on the substrate 10 by coating photoresist (PR) on the whole surface of the substrate 10 using a spin-and-slit coater and patterning the photoresist using an exposure and development processes. This process is time consuming and expensive.

To overcome this problem, the pixel defining layer 30 may be formed on the substrate 10 by inkjet printing. In this case, however, the pixel defining layer 30 cannot be formed in the desired shape (indicated by a dotted line). Specifically, an inkjet printer 300 including an inkjet head 310 and an inkjet nozzle 320 may spray ink 31 for forming the pixel defining layer 30 onto the substrate 10, and the ink 31 may flow laterally on the substrate 10 to form a wide and low pixel defining layer 30, instead of forming the desired shape (indicated by the dotted line).

Ink used in inkjet printing must have a low viscosity in order to be reliably ejected from a micro-passage (not shown) of the inkjet head 310 and the nozzle 320. However, this low viscosity increases the fluidity of the ink, causing the above described phenomenon.

In this case, the pixel defining layer 30 may intrude into a pixel region and thereby reduce the luminous efficiency of the pixel region. In addition, the height of the pixel defining layer 30 may be reduced. Thus, when the color patterns 21 through 23 are formed, their colors may be mixed with each other, resulting in a defect.

In this regard, the color patterns 21 through 23 may be formed on the pixel region of the substrate 10, and then the pixel defining layer 30 may be formed using the color patterns 21 through 23 as barrier ribs. This can reduce the loss of time and material associated with the use of a photoresist process.

There is no particular restriction on the method of forming the color patterns 21 through 23. For example, a fine metal mask (FMM) method, a gravure method, an offset method, or a roll-to-roll method can be used. However, the method of forming the color patterns 21 through 23 is not limited to these methods.

The pixel defining layer 30 may be formed by inkjet printing or nozzle printing, but is not limited thereto.

The substrate 10 may be a backplane (B/P) substrate including a switching device (not shown) and an anode (not shown). The switching device may be a thin-film transistor (TFT) device, but is not limited thereto.

Figure 4A:
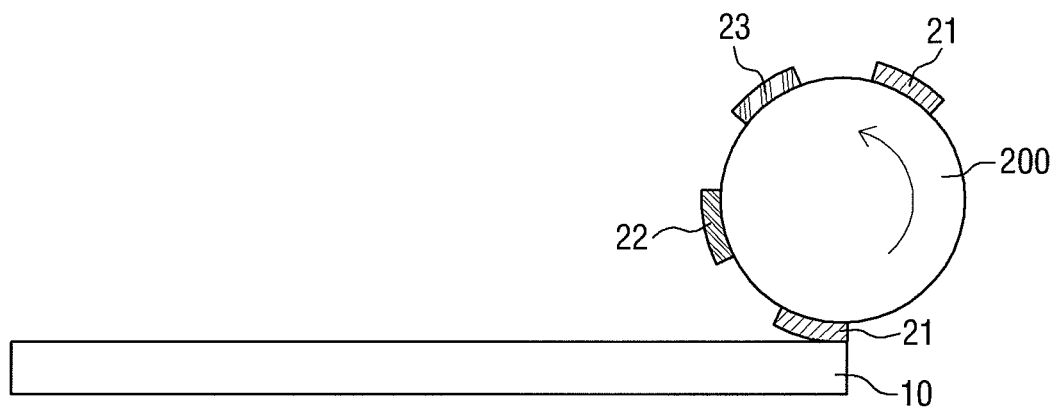
FIGS. 4A through 4C are schematic cross-sectional views illustrating a process of forming color patterns in a process of manufacturing an organic electroluminescence device according to an embodiment.
Figure 4B:
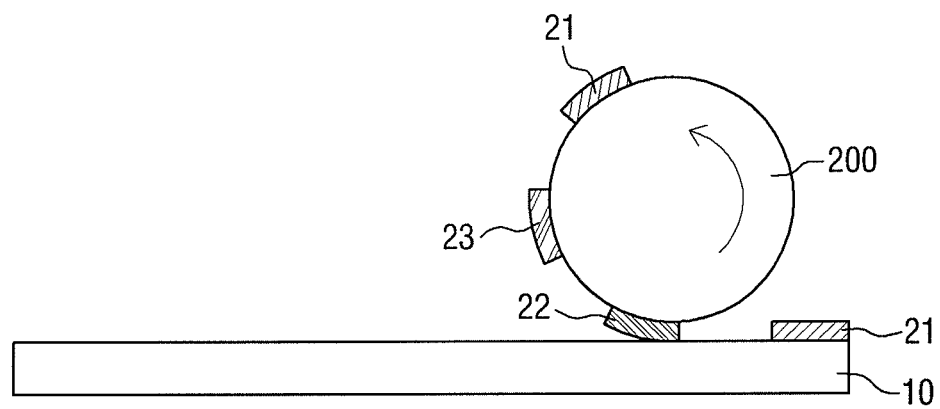
Figure 4C:
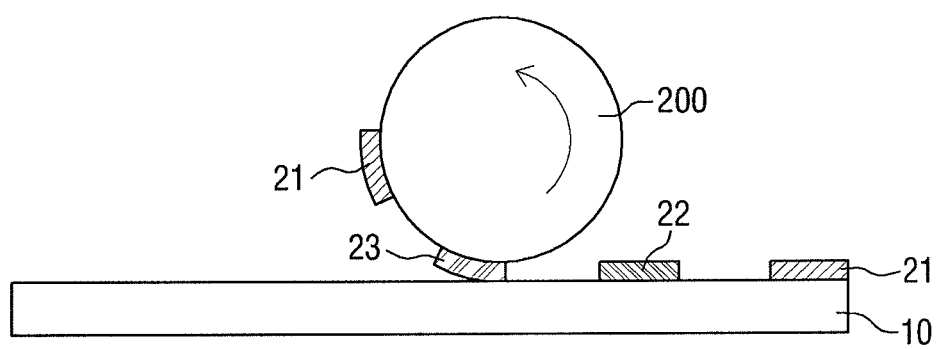
Figure 5A:
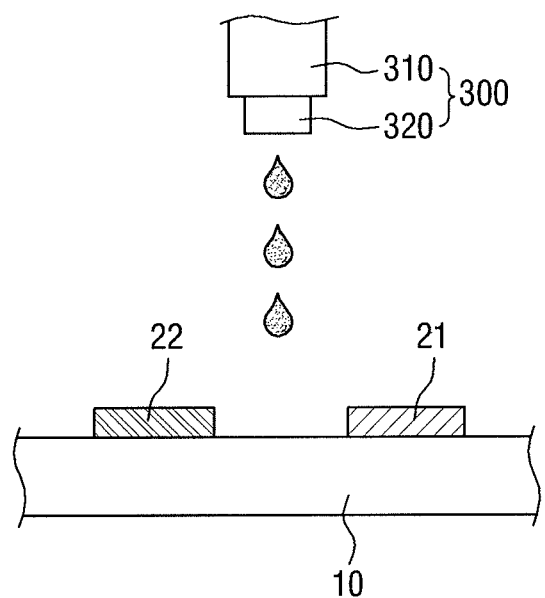
FIGS. 5A and 5B are schematic cross-sectional views illustrating a process of forming a pixel defining layer in a process of forming an organic electroluminescence device according to an embodiment.
Figure 5B:
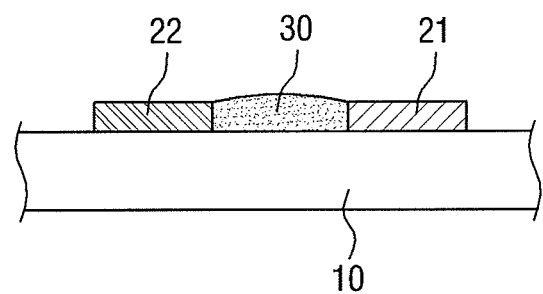

FIGS. 4A through 4C are schematic cross-sectional views illustrating a process of forming color patterns 21 through 23 in a process of manufacturing an organic electroluminescence device according to an embodiment of the described technology. FIGS. 5A and 5B are schematic cross-sectional views illustrating a process of forming a pixel defining layer 30 in a process of forming an organic electroluminescence device according to an embodiment of the described technology.

Referring to FIGS. 4A through 4C, a roller-shaped second printing member 200 is placed on a substrate 10, and the color ink patterns 21 through 23 are formed at regular intervals along the surface of the second printing member 200. The second printing member 200 may sequentially print the color ink patterns 21 through 23 on the surface of the substrate 10 as it rotates on the substrate 10.

To transfer the color ink patterns 21 through 23 formed on the surface of the second printing member 200 to exact positions on the substrate 10, the second printing member 200 and the substrate 10 may be accurately aligned with each other at designated positions by using aligners (not shown).

Referring to FIGS. 5A and 5B, an inkjet printer 300 including an inkjet head 310 and an inkjet nozzle 320 sprays ink 31 for forming the pixel defining layer 30 onto a space between the color ink patterns 21 and 22 formed in advance on the substrate 10. The ink 31 forms the pixel defining layer 30 in a desired shape since the color ink patterns 21 and 22 serve as barrier ribs on the substrate 10.

In this case, ink used to form the color ink patterns 21 through 23 may have a higher viscosity than the ink used to form the pixel defining layer 30. For example, if the viscosity of the ink used to form the color ink patterns 21 through 23 is low, it is generally very difficult to perform roll printing, and the color ink patterns 21 through 23 cannot serve well as barrier ribs on the substrate 10.

There is no particular restriction on the viscosity of the ink used to form the color ink patterns 21 through 23 as long as it is higher than that of the ink used to form the pixel defining layer 30. The viscosity of the ink used to form the color ink patterns 21 through 23 may be in the range of about 70 cp to about 110 cp. If the viscosity of the ink used to form the color ink patterns 21 through 23 is less than about 70 cp, the shapes of the color ink patterns 21 through 23 may be changed during a roll printing process due to the fluidity of the color ink patterns. If the viscosity of the ink exceeds about 110 cp, process adaptability may be reduced, causing a defect. However, depending on the embodiments, the viscosity may be less than above 6 cp or greater than about 20 cp.

There is no particular restriction on the viscosity of the ink used to form the pixel defining layer 30 as long as it can be reliably ejected from a micro-passage (not shown) of the inkjet head 310 and the nozzle 320. In some embodiments, the viscosity of the ink used to form the pixel defining layer 30 is in the range of about 6 cp to about 20 cp. If the viscosity of the ink used to form the pixel defining layer 30 is less than about 6 cp, it may take a long time to form the pixel defining layer 30 when hardening the ink. If the viscosity of the ink exceeds 20 cp, the ink may not be reliably ejected from the micro-passage of the inkjet head 310 or the nozzle 320 due to its high viscosity. Thus, the nozzle 320 may be clogged. In another embodiment, the viscosity of the ink used to form the pixel defining layer 30 ranges from about 9 cp to about 17 cp. However, depending on the embodiments, the viscosity may be less than above 70 cp or greater than about 110 cp.

Figure 6:
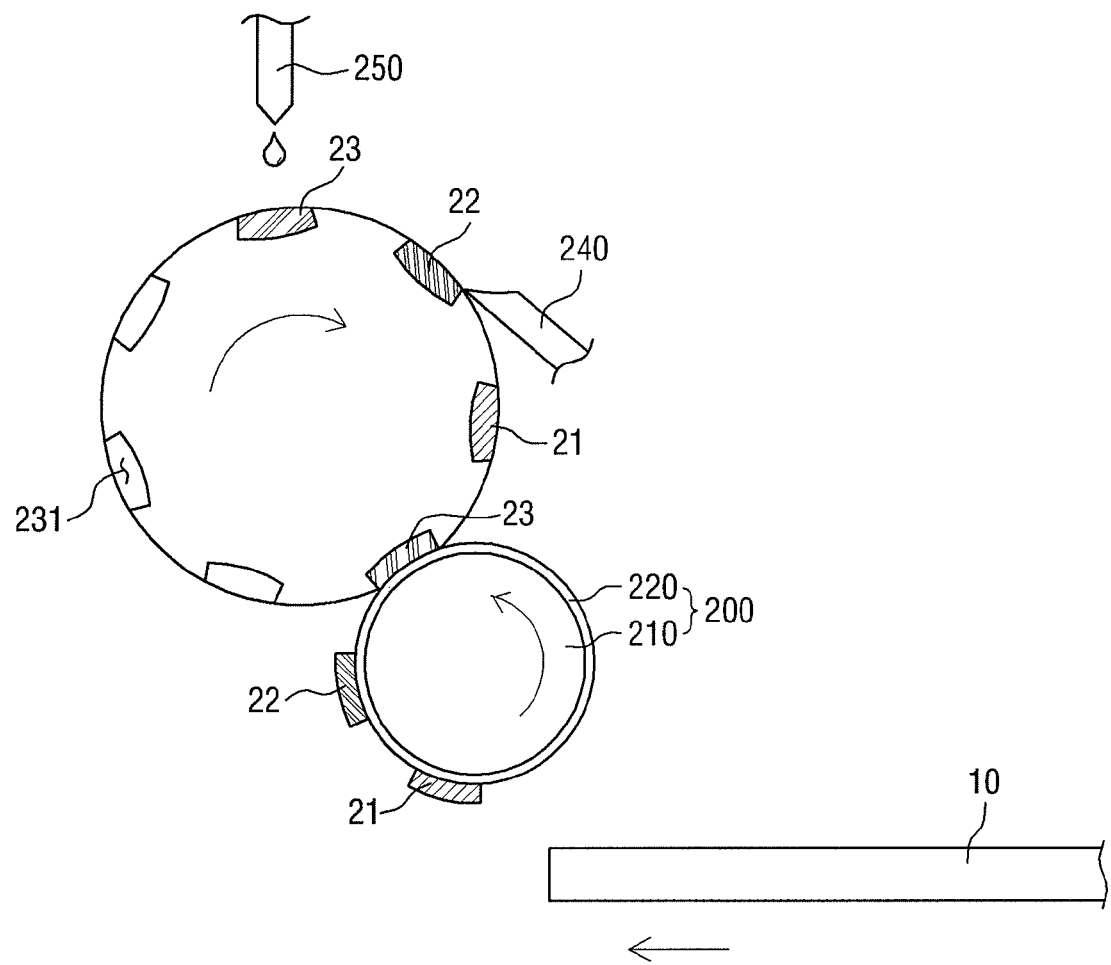
FIG. 6 is a schematic cross-sectional view illustrating a process of forming color patterns in a method of manufacturing an organic electroluminescence device according to another embodiment.

FIG. 6 is a schematic cross-sectional view illustrating a process of forming color patterns 21 through 23 in a method of manufacturing an organic electroluminescence device according to another embodiment of the described technology.

Referring to FIG. 6, the process of forming the color patterns 21 through 23 may use an ink supply unit 250, a first printing member 230, a second printing member 200, and a substrate 10.

The first printing member 230 may be made of glass, plastic, metal, etc, but is not limited thereto. In the current embodiment, the first printing member 230 includes concave portions 231, but is not limited thereto.

The concave portions 231 may be formed by a photolithography method, a molding method or a laser processing method, but is not limited to these methods. The concave portions 231 correspond to the color ink patterns 21 through 23 that are to be transferred to the second printing member 200. Specifically, lengths and/or widths of the concave portions 231 correspond to lengths and/or widths of the color ink patterns 21 through 23.

Ink is supplied from the ink supply unit 250 to the concave portions 231 of the first printing member 230. Depending on the colors to be printed, the concave portions 231 may be filled alternately with red ink, green ink and blue ink, may be filled with white ink, or may be filled alternately with red ink, green ink, blue ink and white ink. In FIG. 6, the concave portions 231 are filled alternately with red ink 21, green ink 22, and blue ink 23.

Unnecessary portions of ink may be scraped with a blade 240, so that the ink can be supplied only to the concave portions 231. The blade 240 may be shaped like a long plate, but is not limited thereto. The blade 240 allows ink to fill only the concave portions 231 by maintaining close contact with a surface of the first printing member 230 along a direction in which the concave portions 231 are disposed while maintaining a predetermined angle with respect to a direction in which the concave portions 231 extend. Color ink used in the described technology may not necessarily be in a liquid state but may instead be in a gel state with the above described viscosity.

Ink filling the concave portions 231 of the first printing member 230 may be transferred onto the second printing member 200 to form intermediate color ink patterns 21 through 23. The second printing member 200 may be formed by mounting a pad 220, which includes a material having certain release properties such as elastic rubber, around a roller 210. However, the described technology is not limited thereto, and the second printing member 200 may also be formed by coating the roller 210 with elastic rubber. Here, the elastic rubber may be, for example, silicon rubber.

The principles of transferring ink from the concave portions 231 of the first printing member 230 onto the second printing member 200 are as follows. If the concave portions 231 and the second printing member 200 are manufactured such that the surface tension or friction of the concave portions 231 is less than that of the ink and the surface tension or friction of the second printing member 200 is greater than that of the ink, the ink can be transferred onto the second printing member 200 while the second printing member 200 rotates in close contact with the first printing member 230. In another method, a surface of each of the concave portions 231 is charged with a positive or negative polarity, and the ink is charged with the same polarity. Accordingly, a repulsive force is created between the surface of each of the concave portions 231 and the ink which causes the ink to drop from the surface of each of the concave portions 231. In this case, if the second printing member 200 is charged with the polarity opposite to that of the ink, the ink is transferred onto the second printing member 200 while the second printing member 200 rotates in close contact with the first printing member 230. The principles of transferring ink have been described above using the case where the ink is transferred from the first printing member 230 to the second printing member 200 as an example. However, the same principles may apply to other processes which will be described later.

The intermediate color ink patterns 21 through 23 transferred onto the second printing member 200 are printed on the substrate 10, thereby forming final color ink patterns. The second printing member 200 and the substrate 10 may be accurately aligned with each other at designated positions by using aligners (not shown), so that the intermediate color ink patterns 21 through 23 can be transferred to exact positions on the substrate 10.

In a specific example, the substrate 10 may be a backplane substrate including a switching device (not shown) and an anode (not shown). The anode may be electrically connected to the switching device (not shown) and operate in response to a switching signal. Each of the color ink patterns 21 through 23 may be formed at a position corresponding to the anode so as to form a pixel region. To this end, an alignment process using aligners is required.

Printing of the color ink patterns 21 through 23 using the structure of FIG. 6 may be performed in-situ. That is, the substrate 10 may move in a direction indicated by the arrow, and the color ink patterns 21 through 23 supplied from the ink supply unit 250 may be successively printed on the substrate 10 via the first printing member 230 and the second printing member 200.

Figure 7:
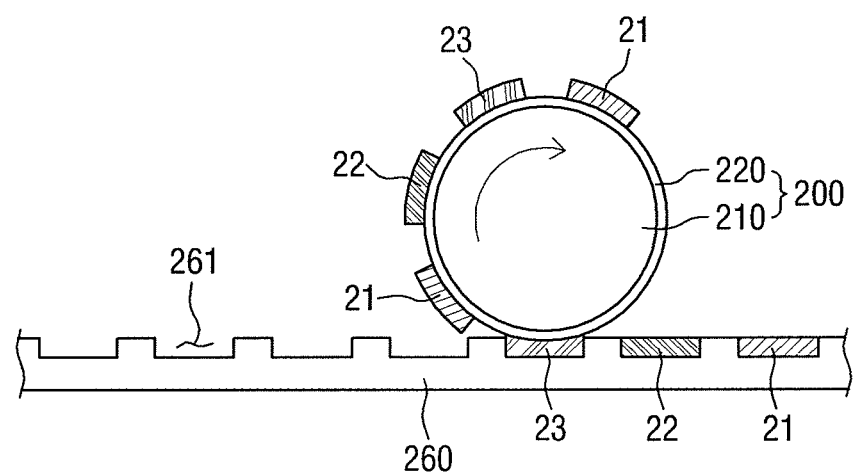
FIG. 7 is a schematic cross-sectional view illustrating another process of forming color patterns in a method of manufacturing the organic electroluminescence device according to an embodiment.
Figure 8A:
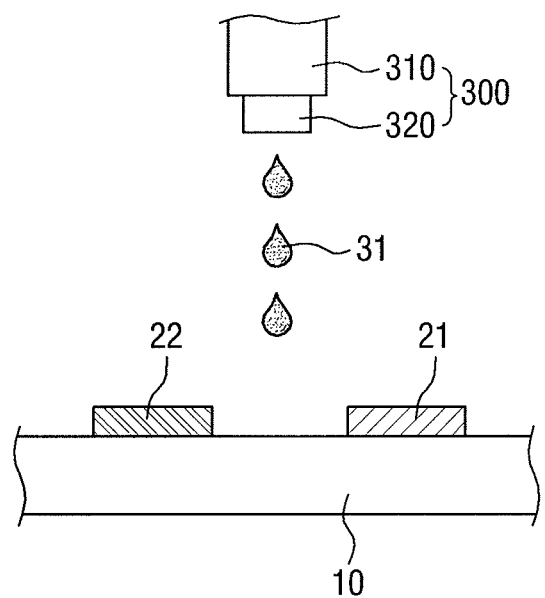
FIGS. 8A through 8D are schematic cross-sectional views illustrating a process of forming a pixel defining layer in a method of manufacturing an organic electroluminescence device according to an embodiment.
Figure 8B:
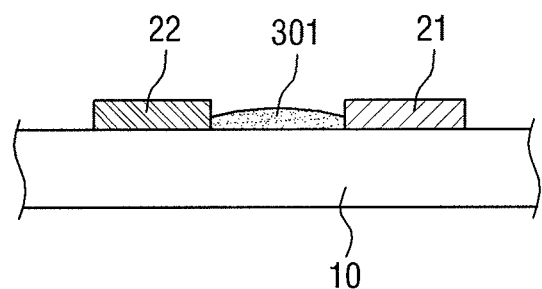
Figure 8C:
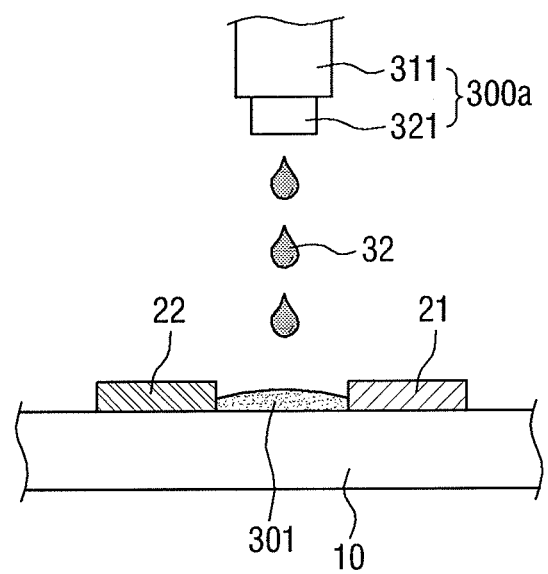
Figure 8D:
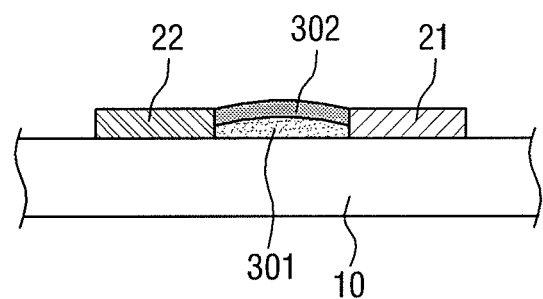

FIG. 7 is a schematic cross-sectional view illustrating another process of forming color patterns 21 through 23 using a method of manufacturing the organic electroluminescence device according to an embodiment of the described technology.

Referring to FIG. 7, a first printing member 260 is a printing plate including concave portions 261.

The first printing member 260 includes the concave portions 261, and the concave portions 261 are filled with color ink. Although not shown in FIG. 7, the concave portions 261 may be filled with color ink by using the ink supply unit 250 and the blade 240 of FIG. 6. In addition, the ink filling the concave portions 261 of the first printing member 260 may be transferred onto a second printing member 200 to form intermediate color ink patterns 21 through 23.

Elements of FIG. 7 are identical to those of FIG. 6 except that the first printing member 260 is shaped like a printing plate, and thus redundant descriptions are omitted.

FIGS. 8A through 8D are schematic cross-sectional views illustrating a process of forming a pixel defining layer in a method of manufacturing the organic electroluminescence device according to an embodiment of the described technology.

Referring to FIGS. 8A through 8D, a first inkjet printer 300 including an inkjet head 310 and an inkjet nozzle 320 sprays ink 31 for forming a first pixel defining layer 301 onto a space between color ink patterns 21 and 22 formed in advance on a substrate 10. The ink 31 forms the first pixel defining layer 301 in a desired shape since the color ink patterns 21 and 22 serve as barrier ribs on the substrate 10. Then, a second inkjet printer 300a including an inkjet head 311 and an inkjet nozzle 321 sprays ink 32 for forming a second pixel defining layer 302 on the first pixel defining layer 301, and the ink 32 forms the second pixel defining layer 302 in a desired shape since the color ink patterns 21 and 22 serve as barrier ribs.

The above described method of forming the pixel defining layer may be advantageous particularly when the first pixel defining layer 301 and the second pixel defining layer 302 have different characteristics.

For example, if a typical photoresist (PR) method (not necessarily prior art) is used to form a pixel defining layer with a double layer as illustrated in FIGS. 8A through 8D, coating, exposure, development and cleaning processes all must be performed twice. In some cases, a planarization process should be additionally performed. Accordingly, the use of such a method causes a great loss of time and material.

Figure 9:
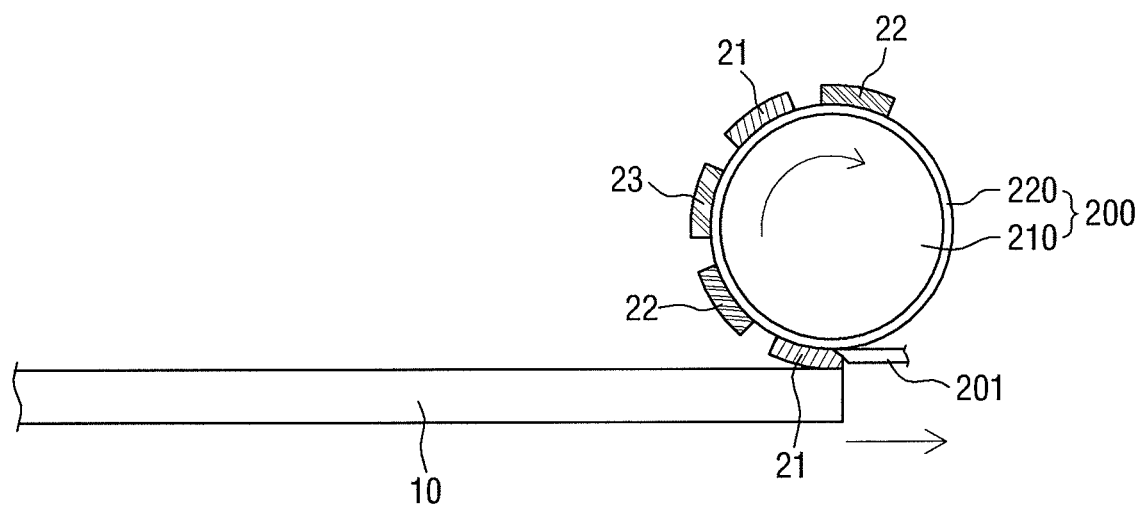
FIG. 9 is a schematic cross-sectional view illustrating a process of forming color patterns in a method of manufacturing an organic electroluminescence device according to another embodiment.

FIG. 9 is a schematic cross-sectional view illustrating a process of forming color patterns 21 through 23 in a method of manufacturing an organic electroluminescence device according to another embodiment of the described technology.

Referring to FIG. 9, intermediate color inks 21 through 23 formed on a second printing member 200 may be printed on a substrate 10, thereby forming final color ink patterns.

The principles of transferring ink from the second printing member 200 onto the substrate 10 are as described above. However, to facilitate the transfer of the ink from the second printing member 200 to the substrate 10, the color ink patterns 21 through 23 may be peeled from a surface of the second printing member 200 by using a peeler 201. In this case, the peeler 201 may be shaped like a long plate, but is not limited thereto. The peeler 201 may peel the intermediate color ink patterns 21 through 23 from the second printing member 200 by remaining in close contact with the surface of the second printing member 200 along a direction in which the intermediate color ink patterns 21 through 23 are disposed while maintaining a predetermined angle at a close point to the substrate 10 and the second printing member 200.

Elements of FIG. 9 are identical to those of FIG. 6 except that the peeler 201 is additionally used, and thus redundant descriptions are omitted.

Figure 10:
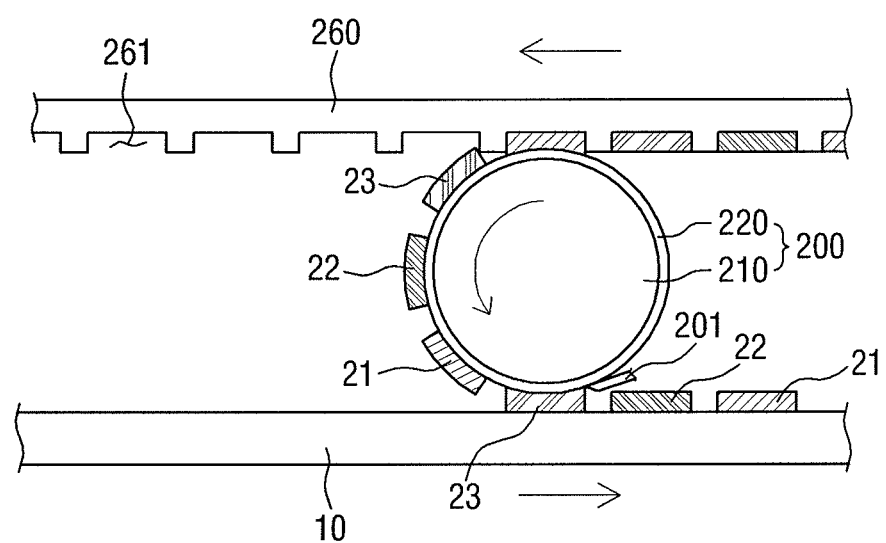
FIG. 10 is a schematic cross-sectional view illustrating a process of forming color patterns in a method of manufacturing an organic electroluminescence device according to another embodiment.

FIG. 10 is a schematic cross-sectional view illustrating a process of forming color patterns 21 through 23 using a method of manufacturing an organic electroluminescence device according to another embodiment of the described technology.

Referring to FIG. 10, a first printing member 260 and a substrate 10 are positioned so as to face each other with a second printing member 200 interposed between them. The first printing member 260 is shaped like a printing plate, and the first printing member 260 and the substrate 10 proceed in opposite directions.

The second printing member 200 is shaped like a roller. A first side of the second printing member 200 is in contact with the first printing member 260, and a second side of the second printing member 200 opposite the first side is in contact with the substrate 10. Thus, the color ink patterns 21 through 23 filling concave portions 261 of the first printing member 260 are transferred onto a surface of the substrate 10.

When the color ink patterns 21 through 23 are transferred from the second printing member 200 onto the substrate 10, they may be peeled from a surface of the second printing member 200 by a peeler 201.

Other elements of FIG. 10 are identical to those of FIGS. 7 and 9, and thus redundant descriptions are omitted.

The foregoing is illustrative of the described technology and is not to be construed as limiting thereof. Although a number of embodiments have been described, those skilled in the art will readily appreciate that many modifications are possible to the embodiments without materially departing from the novel teachings and advantages of the described technology. Accordingly, all such modifications are intended to be included within the scope of the described technology as defined in the accompanying claims. Therefore, it is to be understood that the foregoing is illustrative of the described technology and is not to be construed as limited to the specific embodiments disclosed, and that modifications to the disclosed embodiments, as well as other embodiments, are intended to be included within the scope of the accompanying claims. The described technology is defined by the following claims, with equivalents of the claims to be included therein.

What is claimed is:

1. A method of manufacturing an organic electroluminescence device, the method comprising:
    forming a plurality of color patterns on a substrate; and
    forming a pixel defining layer between the color patterns using the color patterns as barrier ribs, wherein ink used to form the color patterns has a higher viscosity than ink used to form the pixel defining layer.

2. The method of claim 1, wherein the forming of the color patterns is performed via at least one of the following: a fine metal mask (FMM) method, a gravure method, an offset method, and a roll-to-roll method.

3. The method of claim 1, wherein the forming of the pixel defining layer is performed by an inkjet printing method or a nozzle printing method.

4. The method of claim 1, wherein the viscosity of the ink used to form the color patterns is in the range of about 70 cp to about 110 cp.

5. The method of claim 1, wherein the viscosity of the ink used to form the pixel defining layer is in the range of about 6 cp to about 20 cp.

6. The method of claim 1, wherein the pixel defining layer comprises a multilayer structure.

\* \* \* \* \*